(12) United States Patent
Fan et al.

(10) Patent No.: US 6,613,595 B2
(45) Date of Patent: Sep. 2, 2003

(54) TEST STRUCTURE AND METHOD FOR FLASH MEMORY TUNNEL OXIDE QUALITY

(75) Inventors: Tso-Hung Fan, Taipei Hsien (TW); Tao-Cheng Lu, Kaoshiung (TW)

(73) Assignee: Macronix International Co., Ltd., Hsinchu (TW)

( * ) Notice: Subject to any disclaimer, the term of this patent is extended or adjusted under 35 U.S.C. 154(b) by 53 days.

(21) Appl. No.: 10/058,672

(22) Filed: Jan. 28, 2002

(65) Prior Publication Data

US 2003/0134442 A1 Jul. 17, 2003

(30) Foreign Application Priority Data

Jan. 11, 2002 (TW) ........................................ 91100281 A

(51) Int. Cl.[7] .............................................. H01L 21/66
(52) U.S. Cl. .............................. 438/18; 438/14; 438/17; 257/48; 324/158.1; 324/765; 324/766
(58) Field of Search ......................... 257/48; 324/158.1, 324/765, 766; 438/14, 17, 18

(56) References Cited

U.S. PATENT DOCUMENTS

| | | | | | |
|---|---|---|---|---|---|
| 5,798,649 | A | * | 8/1998 | Smayling et al. | 324/551 |
| 6,054,351 | A | * | 4/2000 | Sato et al. | 438/264 |
| 6,133,746 | A | * | 10/2000 | Fang et al. | 324/769 |
| 6,414,334 | B2 | * | 7/2002 | Sugihara et al. | 257/48 |
| 6,509,202 | B1 | * | 1/2003 | Kim | 438/17 |

* cited by examiner

*Primary Examiner*—Kamand Cuneo
*Assistant Examiner*—Asok Kumar Sarkar
(74) *Attorney, Agent, or Firm*—J.C. Patents

(57) ABSTRACT

A method is used for testing a tunneling oxide layer of a flash memory. The method includes providing a test device. The test device includes a diffusion region, a floating gate electrode above the diffusion region, and a tunneling oxide layer disposed between the diffusion region and the floating gate electrode. Multiple contacts are disposed over the periphery of the floating gate but not over the diffusion region. Multiple contacts are disposed over the diffusion region. A first voltage is applied to the floating-gate contacts and A second voltage is applied on to the diffusion-region contacts.

18 Claims, 5 Drawing Sheets

TEST STRUCTURE AND METHOD FOR FLASH MEMORY TUNNEL OXIDE QUALITY

CROSS-REFERENCE TO RELATED APPLICATION

This application claims the priority benefit of Taiwan application Ser. No. 91100281, filed Jan. 11, 2002.

BACKGROUND OF THE INVENTION

1. Field of Invention

The present invention relates to a test structure and a test method. More particularly, the present invention relates to a test structure and a test method for a flash memory.

2. Description of Related Art

The flash memory is a type of electrically erasable programmable ROM (EEPROM), which has advantages of writing, erasing, and data remaining after power being off, and is a memory device widely used in various personal computer and electronic equipment. Moreover, the flash memory is also a type of non-volatile memory, which has advantages of small dimension, high access speed, and low power consumption. In addition, since the data erasing operation is done in a manner of block by block, the operation speed is faster.

Since the quality of tunneling oxide layer of the flash memory device would affect the lifetime of the flash memory device, a test process usually is performed after the flash memory device has been done. This is to test the quality of the tunneling oxide layer and then predict the lifetime of the tunneling oxide layer.

FIG. 1 is a top view, schematically illustrating a test device for the tunneling oxide layer of the flash memory device.

In FIG. 1, the conventional test device 100 includes a control gate electrode 101, a floating gate electrode 102, a tunneling oxide layer (not seen), a diffusion region 104, and several contact 106.

The floating gate electrode 102 is disposed on the diffusion region 104. The control gate electrode 101 is disposed on the floating gate electrode 102. The tunneling oxide layer is disposed between the floating gate electrode 102 and the diffusion region 104. Several contact structures 106 are disposed along one side of the floating gate electrode 102, in which the contact structures are electrically connected through a metal line 108.

The conventional method for testing the quality of the tunneling oxide layer is that a voltage is applied on the metal line 108 of the conventional test device 100. Then, a testing result is obtained, so as to predict the lifetime of the tunneling oxide layer.

FIG. 2 is a drawing, illustrating a voltage distribution resulted from the test method on the conventional test device.

In FIG. 2, the X axis and Y axis respectively indicate the position where is the test is done. The Z axis in FIG. 2 represents the quantity of the measured voltage in volt. According to the voltage distribution in FIG. 2, when the convention test device is used to test the tunneling oxide layer of the flash memory, the distribution of voltage drop clearly is not uniform. This would result in non-uniform distribution of tunneling current, which flows through the tunneling oxide layer.

The reasons to cause the non-uniform distribution of the voltage drop and the tunneling current is that the contact structures of the conventional test device are only disposed along one side of the floating gate electrode. In this manner, the voltage drop only occurs at the regions, which have the contact structures. For this situation, the testing results can only reflect the quality with respect to the side portion. The quality of the tunneling oxide located at the other sides and the central portion is then ignored. Thus, it has poor precision of test result and low reliability for the test method performed on the test device.

Moreover, since the conventional test device is used for test on the floating gate electrode with a rather larger area, the floating gate electrode has larger sheet resistance, resulting in that the testing result is usually better than the actual quality.

Furthermore, since the conventional test device has only one row of contact structures, disposed along one side, it will cause a non-uniform distribution of voltage drop and tunneling current during the testing procedure. The non-uniform distribution of voltage drop and tunneling current would result in a better testing result than the actual quality. In this situation, the test device associating with the test method cannot provide a precise testing result with reliability.

SUMMARY OF THE INVENTION

It is an object of the invention to provide a test structure and a test method for a flash memory, so as to avoid the non-uniform distribution of voltage drop and tunneling current, which occurs in the convention method.

It is another object of the invention to provide a test structure and a test method for a flash memory, so as to more precisely predict the lifetime of the tunneling oxide, and thereby improve the reliability of the testing result.

As embodied and broadly described herein, the invention provides a method for testing a tunneling oxide layer of a flash memory. The method includes providing a test device. The test device includes a diffusion region, a floating gate electrode above the diffusion region, and a tunneling oxide layer disposed between the diffusion region and the floating gate electrode. In addition, a number of contacts over the floating gate electrode are disposed along a peripheral region of the test device. It has no a diffusion region under a portion of the floating gate electrode, which has the floating-gate contacts. In addition, a number of diffusion-region contacts are disposed over the diffusion region. Between the floating-gate contacts are electrically connected through a first metal line. The diffusion-region contacts are electrically connected by a second metal line. Then, a first voltage is applied to the floating-gate contacts and a second voltage is applied on to the diffusion-region contacts.

The invention also provides a test device for use on testing a tunneling oxide layer. The test device includes a diffusion region, a tunneling oxide layer, a floating gate electrode, a number of floating-gate contacts, and a number of diffusion-region contacts. The floating gate electrode is disposed above the diffusion region. The tunneling oxide layer is disposed between the diffusion region and the floating gate electrode. The floating-gate contacts are disposed along the periphery of the floating gate electrode. It has no the diffusion region below a portion of the floating gate electrode with the floating-gate contacts. The diffusion-region contacts are disposed at the periphery of the diffusion region. The test device of the invention has, for example, a gear-like structure along the periphery, wherein an indent region exposes a portion of tunneling oxide layer above the diffusion layer. The diffusion-region contacts are disposed within the indent region of the gear-like structure. In addition, diffusion-region contacts are also disposed at the interior region of the test device, that is, the interior region of the floating gate electrode. The diffusion-region contacts expose the diffusion region and form a net-like structure. Moreover, the test device of the invention further includes a first conductive line and a second conductive line. The first conductive line is disposed over the floating-gate contacts, so as to electrically connect each together. The second conductive line is disposed over the diffusion-region contacts, so as to electrically connected together.

The test device and the method for testing the tunneling oxide layer of the flash memory include the contacts, which are evenly distributed over the test device at the periphery and the interior region. As a result, during testing, the voltage drop and the tunneling current can be more uniform. Therefore, the precision of the testing result and reliability are improved.

The difference of the test device for testing the tunneling oxide layer of the flash memory in the invention is including the design of diffusion-region openings. When the test device is under the test by perform a Qbd measurement, which accumulate the breakdown voltage, the voltage can be set to be substantially equal to the voltage needed by the flash memory for Negative Gate Source-side Erase (NGSE).

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
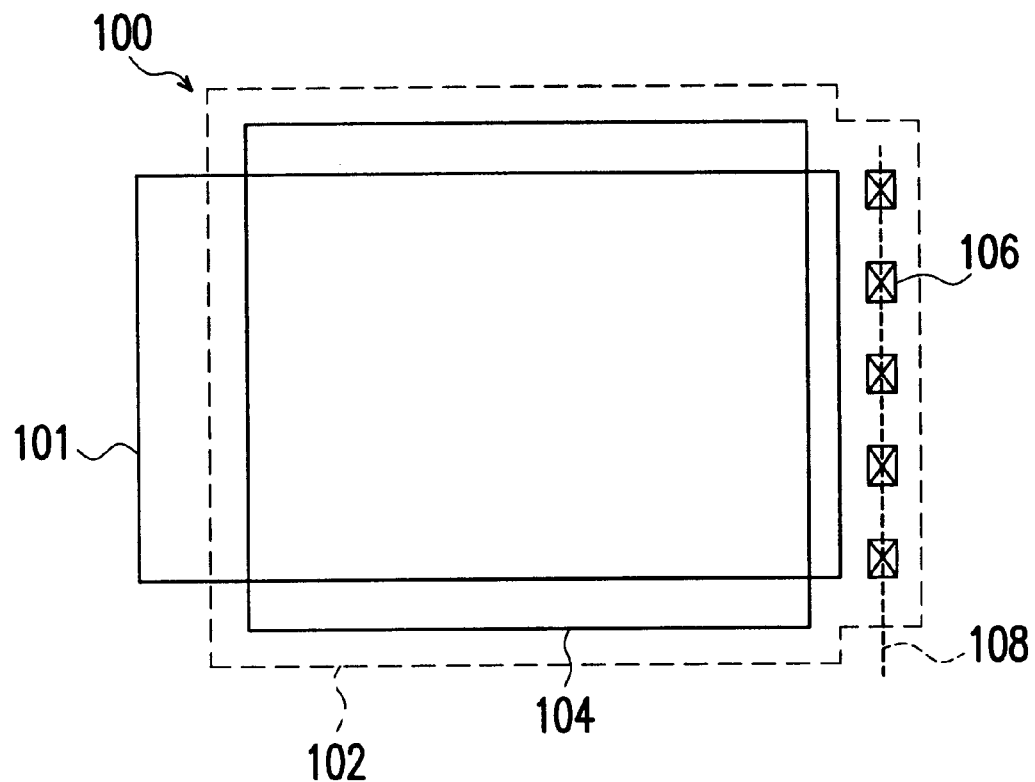
FIG. 1 is a top view, schematically illustrating a test device for the tunneling oxide layer of the flash memory device.
Figure 2:
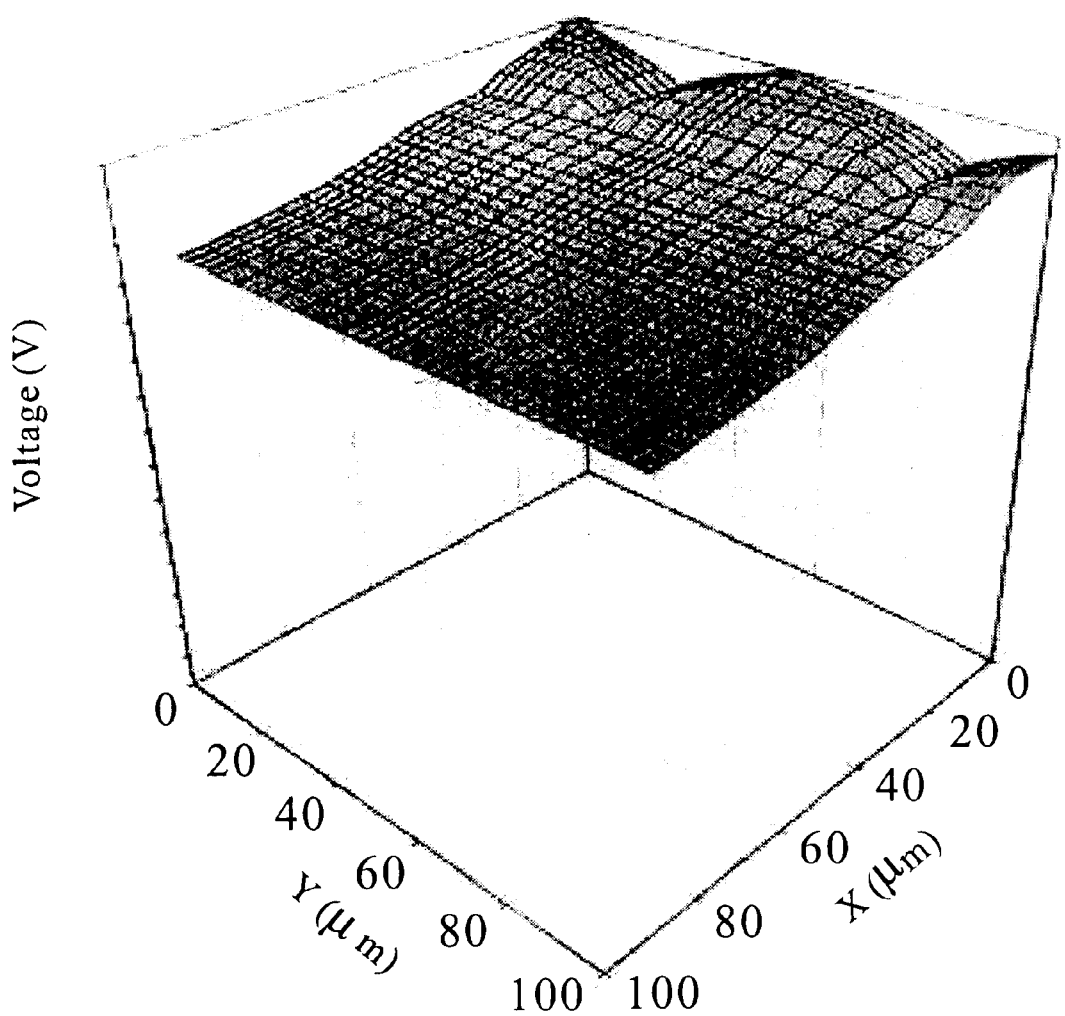
FIG. 2 is a drawing, illustrating a voltage distribution resulted from the test method on the conventional test device.
Figure 3:
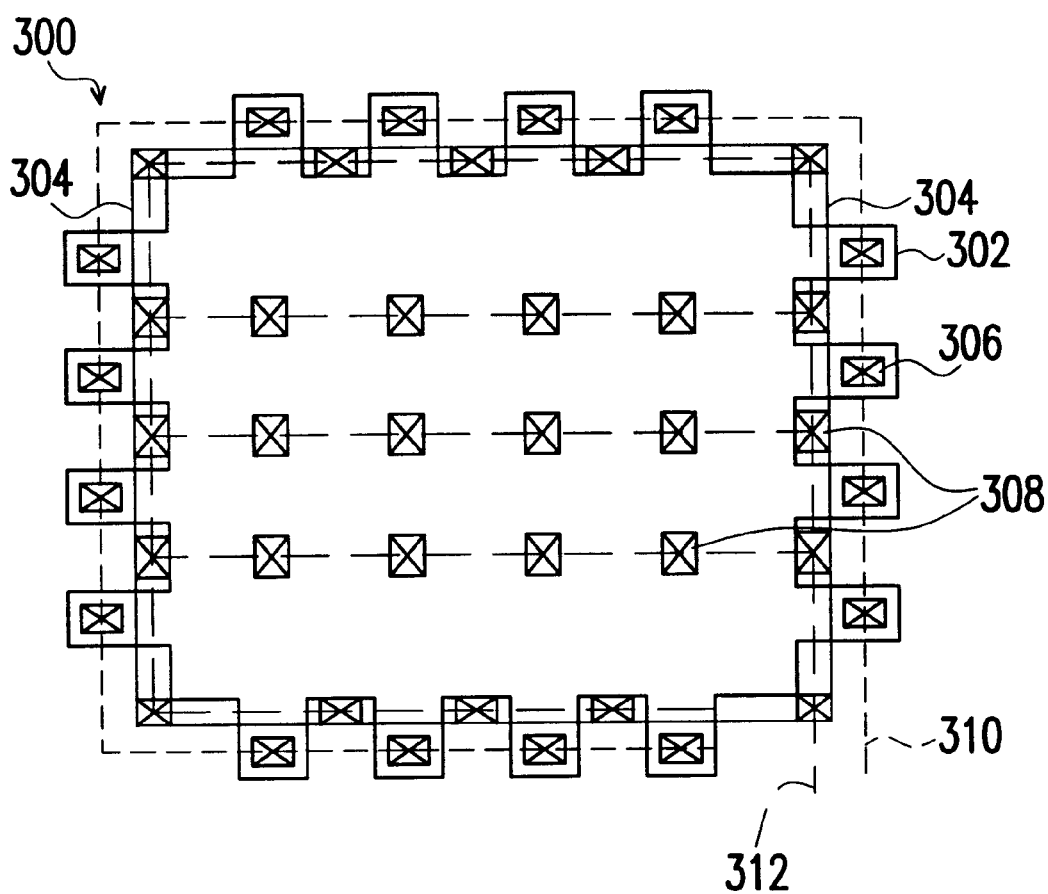
FIG. 3 is a top view, schematically illustrating a test device for the tunneling oxide layer of the flash memory device, according to one preferred embodiment of the invention.

FIG. 3 is a top view, schematically illustrating a test device for the tunneling oxide layer of the flash memory device, according to the preferred embodiment of the invention.

In FIG. 3, the test device 300 of the invention includes a diffusion region 304, a tunneling oxide layer (not seen), a floating gate 302, a number of floating-gate contact 306, and a number of diffusion-region contacts 308.

The floating gate 302 is disposed over the diffusion region 304. The floating gate 302 includes, for example, polysilicon. The diffusion region 304 is, for example, a diffuse region doped with N-type dopants. The tunneling oxide layer is disposed between the diffusion region 304 and the floating gate 302.

The floating-gate contact 306 is disposed on the floating gate 302 at the periphery region of the test device 300, wherein the region under the floating-gate contact 306 has no the diffusion region 304. In the embodiment, the periphery of the floating gate 302 has a gear-like structure. The gear-like structure has protruding region, where the diffusion region 304 does not extends there. As a result, the protruding regions of the gear-like structure are respectively disposed with the floating-gate contact 306. In addition, the floating-gate contact 306 are connected by a conductive line 310, so that the floating-gate contact 306 are electrically connected to each other. The conductive layer 310 includes, for example, metallic material.

The diffusion-region contacts 308 are disposed on the diffusion region 304 at the periphery of the test device 300. Since the periphery of the floating gate 302 is a gear-like structure, the gear-like structure has several indent regions, which expose the tunneling oxide layer above the diffusion 304. Therefore, in the invention, the diffusion region 308 can be disposed within the indent regions of the gear-like structure of the floating gate 302.

Moreover, the diffusion-region contacts 308 of the invention not only can be disposed at the periphery of the diffusion region 304 in the test device 300, but also can be disposed at the interior region of the test device 300. That also means that the diffusion-region contacts 308 are disposed at the interior region of the floating gate 302 and expose the diffusion 304. The floating gate 302 thereby form a net-like pattern. Moreover, the diffusion-region contacts 308 are connected through another conductive line 312, so as to allow the diffusion-region contacts 308 to be electrically connected to each other. The conductive line 312 includes, for example, metallic material.

Then, a voltage Vg is applied on the conductive line 310 through the floating-gate contact 306. Also and, a voltage Vd is applied on the conductive line 312 through the diffusion-region contacts 308. As a result, a testing result can be obtained.

Figure 4:
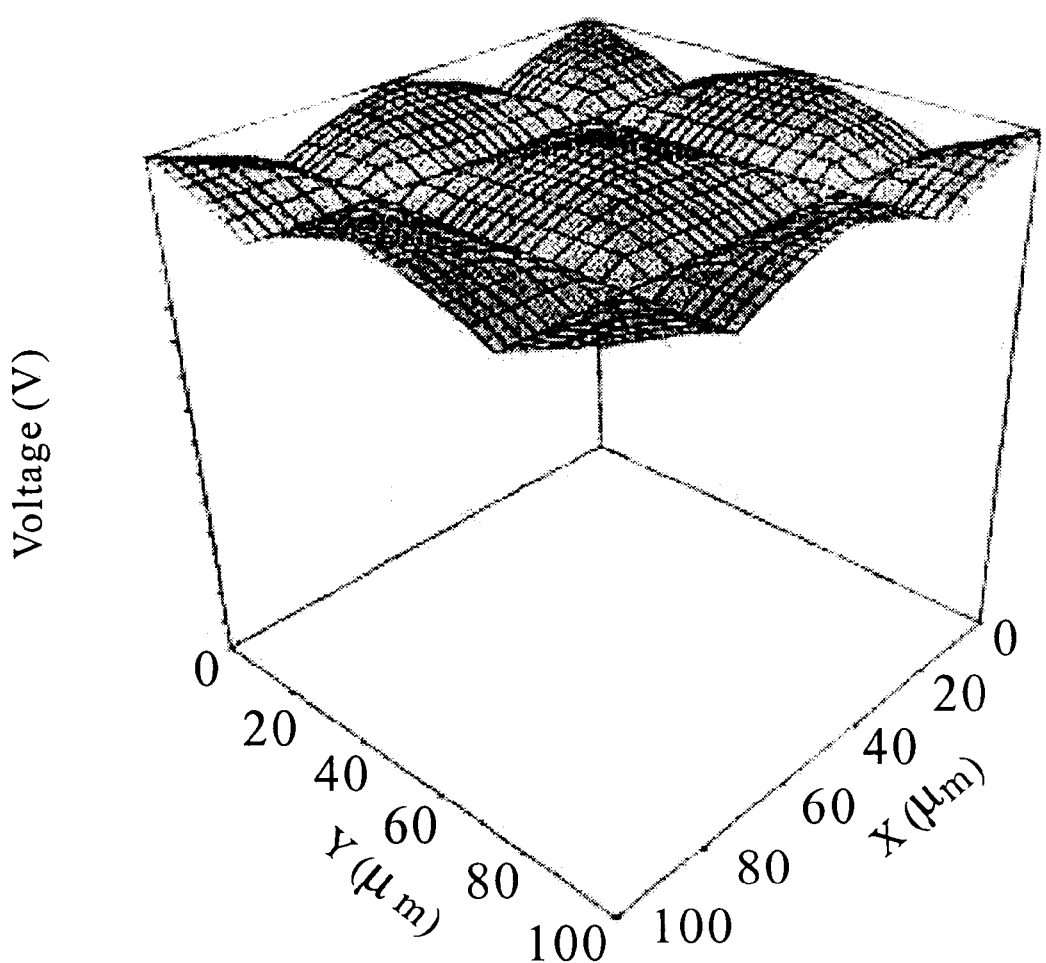
FIG. 4 is a drawing, illustrating a voltage distribution resulted from the test method on the test device according to the conventional test device and the preferred embodiment of this invention.

FIG. 4 is a drawing, illustrating a voltage distribution resulted from the test method on the test device according to the preferred embodiment of this invention.

In FIG. 4, the X axis and the Y axis indicate the location on the test device. The Z axis represents the voltage value in volt. According to the FIG. 4, it is clear that the test method of the invention has more uniform distribution of voltage drop and tunneling current during testing procedure. That is because the floating-gate contact of the test device are more evenly distributed over the periphery but not like the convention manner that distributes only at a partial region. Moreover, the periphery of the diffusion is also disposed with diffusion-region contacts. The diffusion-region contacts can even distributed into the interior region. Therefore, the method of the invention can be used to test quality of the tunneling oxide layer with greater precision and then have higher reliability of test result.

Figure 5:
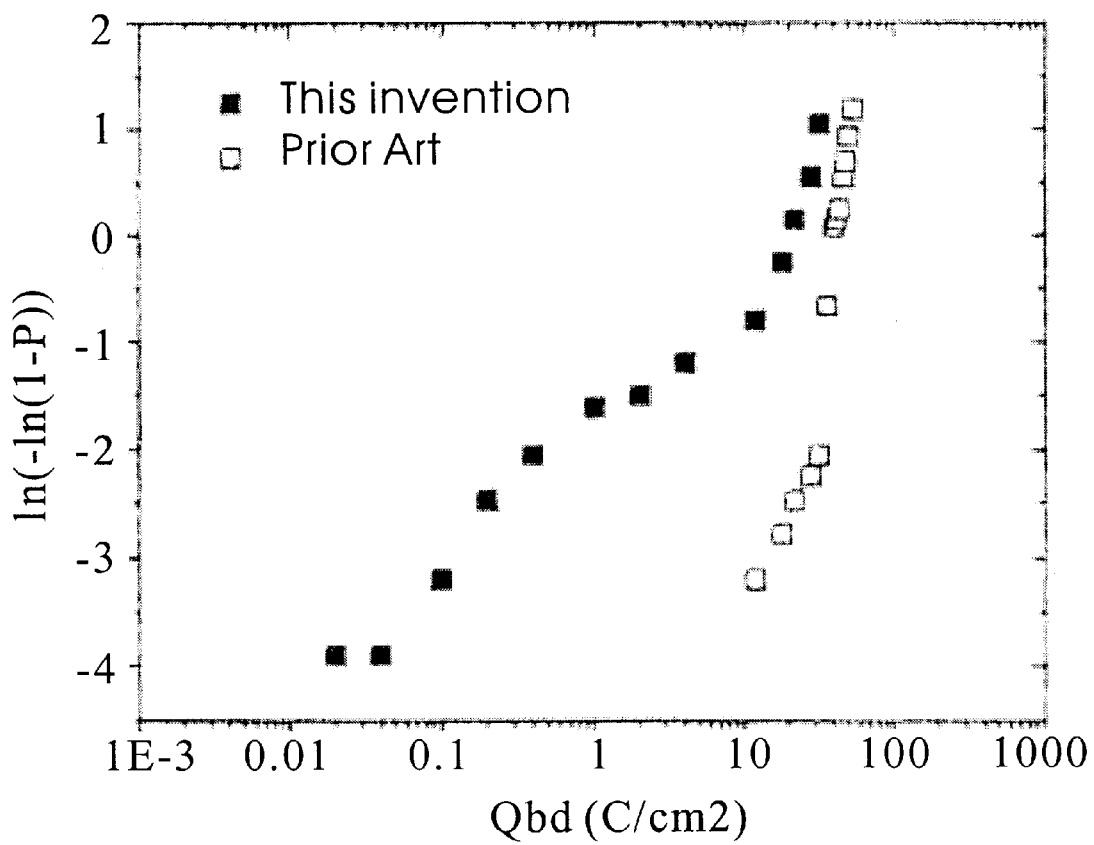
FIG. 5 is a drawing, schematically illustrating the accumulation of break-down voltage, according to the preferred embodiment of this invention.

FIG. 5 is a drawing, schematically illustrating the accumulation of breakdown voltage, according to the conventional test device and the preferred embodiment of this invention.

In FIG. 5, using the method of the invention to perform the measurement of the accumulated breakdown charges, the results are compared with the results made by the conventional method. The curve of the measured accumulated breakdown charges under the invention has lower and wider that the accumulated breakdown charges measured by the conventional test device. The lifetime of the tunneling oxide layer estimated through test device of the invention is shorter than the lifetime estimated through the conventional test device and the test method.

In the foregoing description, the testing result made through the conventional test device and method usually has overestimation on the tunneling oxide layer. Therefore, the precision and reliability of the testing result from the convention test device and method is lower that the invention. On the contrary, the testing result from the test device and method of the invention can more precisely reflect the actual situation without overestimating the lifetime of the tunneling oxide layer.

In conclusions, the invention at least includes the advantages as follows:

1. In the test device and the test method for the tunneling oxide layer of the flash memory device, since the contacts are rather uniformly distributed over the periphery and even in the interior region, the distribution of the voltage drop and tunneling current is more uniform during testing process. This can improve the precision and reliability of the test result.

2. In the test device and the test method for the tunneling oxide layer of the flash memory device, the design of contacts in the invention is different to the design of test device in the conventional method. Thus, when the test device of the invention is used for accumulating the breakdown charges, the voltage can be set to be about equal to the voltage used for erasing in the flash memory.

It will be apparent to those skilled in the art that various modifications and variations can be made to the structure of the present invention without departing from the scope or spirit of the invention. In view of the foregoing, it is intended that the present invention covers modifications and variations of this invention provided they fall within the scope of the following claims and their equivalents.

What is claimed is:

1. A method for testing tunneling oxide layer of a flash memory, the method comprising:
   providing a test device, wherein the test device includes a diffusion region, a floating gate electrode above the diffusion region, and a tunneling oxide layer disposed between the diffusion region and the floating gate electrode, wherein a plurality of floating-gate contacts are formed over a periphery of the floating gate electrode but not over the diffusion region, and a plurality of diffusion-region contacts are formed over a periphery of the diffusion region; and
   applying a first voltage to the floating-gate contacts and a second voltage to the diffusion-region contacts, so as to test the tunneling oxide layer.

2. The method of claim 1, wherein a peripheral region of the floating gate electrode comprises a gear-like structure, wherein an indent region exposes a portion of the tunneling oxide layer above the diffusion region.

3. The method of claim 2, wherein the diffusion-region contacts are also formed at the indent region of the gear-like structure.

4. The method of claim 2, wherein the floating-gate contacts are also formed at a protruding region of the gear-like structure.

5. The method of claim 1, wherein the diffusion-region contacts are also formed at an interior region of the floating gate electrode, and expose the diffusion region.

6. The method of claim 1, wherein the floating gate electrode includes polysilicon.

7. The method of claim 1, further comprising forming a first conductive line to electrically connect the floating-gate contacts.

8. The method of claim 1, further comprising forming a second conductive line to electrically connect the diffusion-region contacts.

9. The method of claim 1, wherein the diffusion region is doped with N-type dopants.

10. A test device used for testing tunneling oxide layer of a flash memory, the test device comprising:
    a diffusion region;
    a floating gate electrode, disposed above the diffusion region;
    a tunneling oxide layer, disposed between the diffusion region and the floating gate electrode;
    a plurality of floating-gate contacts, disposed at a periphery of the floating gate electrode, wherein a portion of the floating gate electrode with the floating-gate contacts does not have the diffusion region; and
    a plurality of diffusion-region contacts, disposed at a periphery of the diffusion region.

11. The test device of claim 10, wherein the periphery of the floating gate electrode includes a gear-like structure, which has an indent region to expose the tunneling oxide layer above the diffusion region.

12. The test device of claim 11, wherein the indent region of the gear-like structure has the diffusion-region contacts.

13. The test device of claim 11, wherein the gear-like structure has a protruding region, on which the floating-gate contacts are disposed.

14. The test device of claim 10, wherein the diffusion-region contacts are also disposed at an interior region of the floating gate electrode, and expose a portion of the diffusion region.

15. The test device of claim 10, wherein the floating gate electrode comprises polysilicon.

16. The test device of claim 10, further comprising a first conductive line, disposed over the floating-gate contacts, so as to have the electrical connection to each other.

17. The test device of claim 10, further comprising a second conductive line, disposed over the diffusion-region contacts, so as to have the electrical connection to each other.

18. The test device of claim 10, wherein the diffusion region comprises an N-type diffusion region.

* * * * *